AUTOMATIC SEARCH SWEEP FOR ATOMIC FREQUENCY STANDARD

Filed April 24, 1964

3 Sheets-Sheet 1

INVENTOR.
ROBERT J. RORDEN

BY

Wm J. Nolan

ATTORNEY

AUTOMATIC SEARCH SWEEP FOR ATOMIC FREQUENCY STANDARD

Filed April 24, 1964

INVENTOR.
ROBERT J. RORDEN

BY

ATTORNEY

INVENTOR.
ROBERT J. RORDEN
BY [signature]
ATTORNEY

United States Patent Office 3,364,438
Patented Jan. 16, 1968

3,364,438

AUTOMATIC SEARCH SWEEP FOR ATOMIC FREQUENCY STANDARD

Robert J. Rorden, Palo Alto, Calif., assignor to Varian Associates, Palo Alto, Calif., a corporation of California Filed Apr. 24, 1964, Ser. No. 362,513
10 Claims. (Cl. 331—3)

This invention relates generally to oscillators, and in particular to oscillators stabilized by passive atomic resonance devices such as beam tubes.

It is known that atomic beam tubes may be used as extremely accurate frequency standards. In such known apparatus, a frequency signal is derived from a controllable oscillator and is applied to a passive atomic resonance device, such as a frequency standard. The signal from the oscillator is frequency modulated or swept causing the signal to vary about the center frequency generated by the oscillator. The standard has one center resonant frequency, and if the center of the frequency modulated signal applied from the oscillator is coincident with the center resonant frequency of the standard, a detector associated with the standard derives a maximum signal amplitude. However, if the center of the applied frequency modulated signal is different than the standard resonance frequency, the frequency modulation has the effect of causing the atomic resonator or standard to produce a greater signal when the frequency is swept in one direction than the other.

In operation, the signal from the atomic resonator is compared with the frequency modulating signal by means of a phase detector to produce an error output signal. This output signal from the phase detector serves in a feedback system to control and stabilize the oscillator frequency at the center resonance frequency of the beam tube. In this manner, the oscillator frequency is effectively locked to the resonance frequency of the standard. Since the resonance frequency of atomic beam standards can be made invariant with temperature, pressure, humidity, time and other effects, the oscillator frequency remains constant in spite of wide variations in these parameters.

While systems of the type described have been successful in providing frequency standards of great stability, a problem has existed in initially adjusting the frequency control circuits. Adjustment has generally been accomplished by audio frequency modulating the microwave energy applied to the beam tube and by detecting the in-phase audio oscillations deriving from the tube. If only the in-phase oscillations are relied upon to indicate resonance of the beam tube, the true center of resonance may not be attained because the standard may be locked by this means to one of the side peaks instead of the central resonance peak. This is to be avoided because the center frequency peaks are not invariant. The frequency of the center peaks depends on beam tube construction and the velocity of the atoms which make up the beam.

In accordance with the present invention, an automatic search for the center resonant frequency of an atomic beam tube is achieved by a system that combines the in-phase, quadrature and second harmonic components deriving from the beam tube. The searching operation is carried out as long as the second harmonic component is less than a predetermnied amplitude, and the first harmonic in-phase and quadrature components both exceed predetermined amplitudes. Only when these criteria are all established does the system automatically switch from a search state to a stabilized status whereby the standard is stabilized with reference to the true center of atomic resonance.

Atomic resonance devices commonly have a number of undesirable resonances, the frequency of which is dependent on the value of the magnetic field in the region of interaction. A feature of this invention resides in eliminating the tendency of the standard to lock to one of the magnetically dependent resonance lines, in case the main oscillator of the frequency standard is sufficiently detuned from its proper frequency thereby causing detection of one of the magnetic resonances. This may be achieved by periodically varying the usually static magnetic field in the interaction region of the atom beam tube. The periodic variation of the field causes the frequency of the magnetically dependent resonances to vary over a wide range in response to the varying magnetic field. As a result, the output of the beam tube is greatly reduced if the oscillator is tuned across one of the resonance lines. The automatic sweep control system of this invention can then be easily adjusted so as not to respond to the reduced output signal from the beam tube.

It is, accordingly, an object of the present invention to provide a new and improved stabilized oscillator employing an atomic resonant device in its feedback circuit.

Another object of the present invention is to provide an oscillator stabilized by atomic resonance wherein searching for the center of atomic resonance is accomplished automatically so that errors resulting in manual tuning are obviated.

An additional object of the present invention is to provide a system for reaching the center of atomic resonance of a beam tube stabilized oscillator wherein an automatic control signal is derived in response to the in-phase and quadrature fundamental and second harmonic components of a low frequency signal deriving from the tube.

The above and still further objects, features and advantages of the present invention will become apparent upon consideration of the following detailed description of several specific embodiments thereof, especially when taken in conjunction with the accompanying drawings, wherein:

FIG. 1 is a block diagram of a preferred embodiment of the invention;

FIGS. 2A–C are plots useful in understanding the system of FIG. 1;

Figure 1:
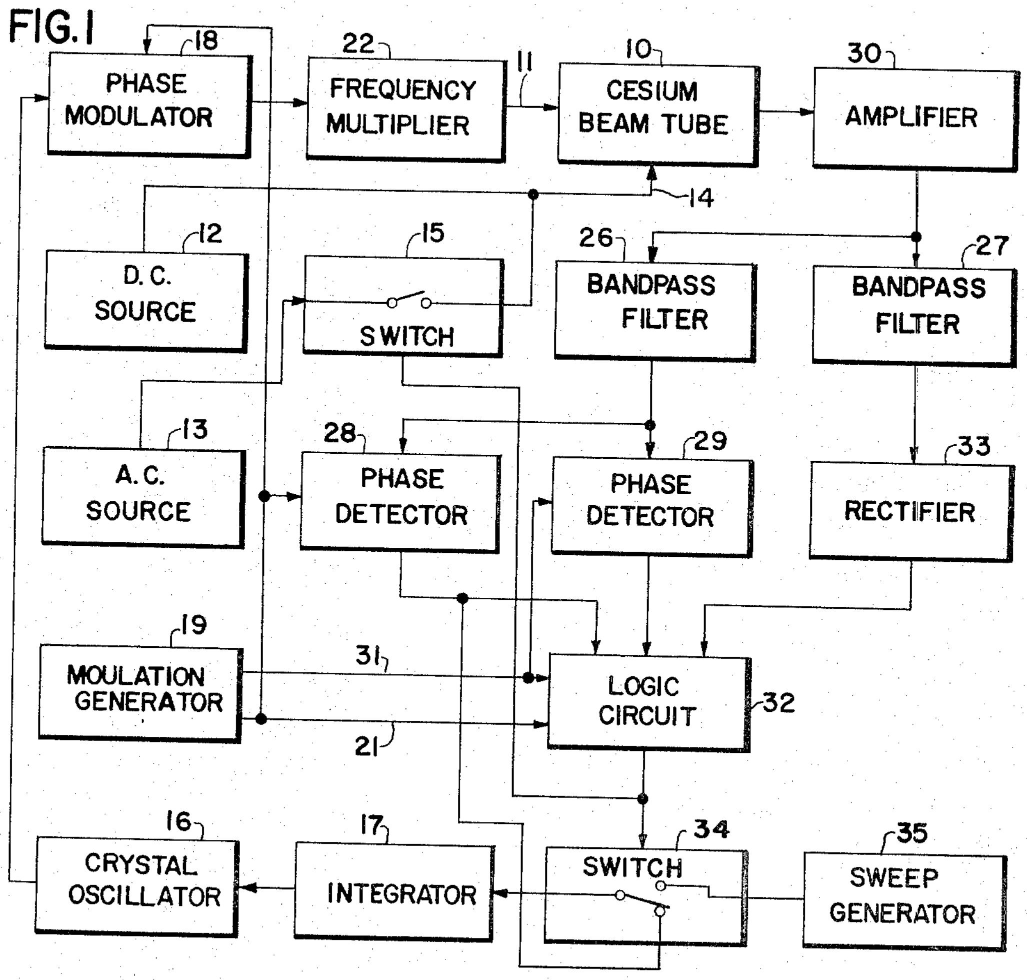

Reference is now made to FIG. 1 of the drawings where there is illustrated an atomic frequency standard comprising cesium beam tube 10. Tube 10 is energized by a frequency modulated microwave signal on lead 11 and a static magnetic field applied via a coil internal thereof. The static magnetic field intensity is controlled in response to the potential applied to the coil by D.C. source 12 and audio frequency power source 13, both connected to lead 14 and the latter source being coupled to the coil via normally closed switch 15. The microwave signal on lead 11 is frequency modulated at the audio rate of 100 cycles per second to enable audio frequency control signals to be derived at the output of beam tube 10. The F.M. microwave input to beam tube 10 is derived from crystal oscillator 16, the radio frequency of which is controlled in response to the D.C. voltage generated by integrator 17. The waves produced by oscillator 16 are frequency modulated in phase modulator 18 with the 100 cycle, reference (zero) phase voltage deriving from modulation generator 19 on lead 21. The output of phase modulator 18 is applied to frequency multiplier 22 that produces the frequency modulated microwave energy applied to tube 10.

Figures 2A, 2B, 2C:
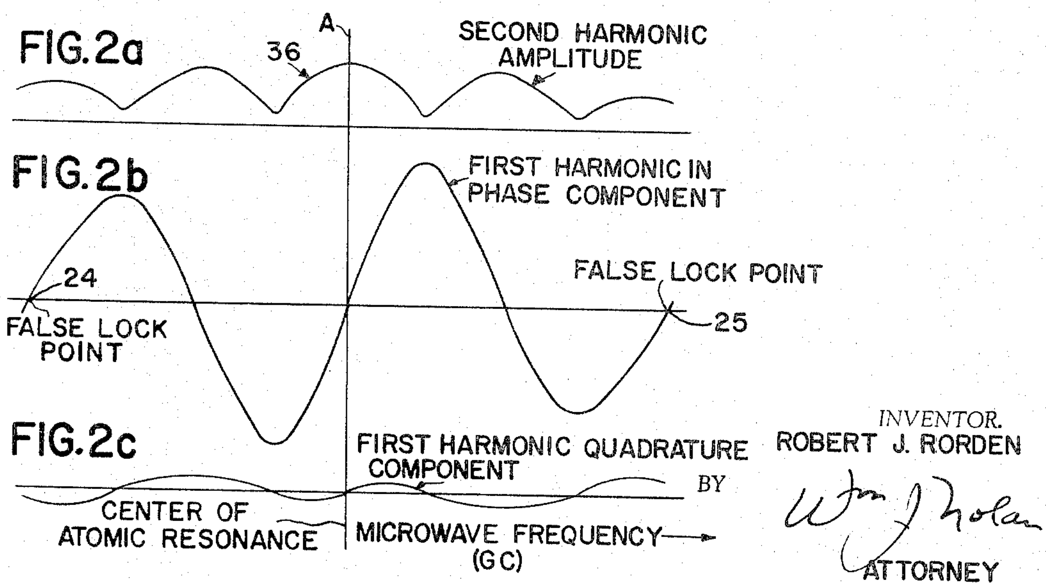

The frequency of beam tube 10 is controlled in response to the intensity of the static magnetic "C" field, hence the signal amplitude on lead 14, as well as the frequency of the microwave energy on lead 11. In the immediately following discussion, "C" field intensity is presumed constant and only the variable frequency effects of the microwave energy are considered; the effects of "C" field variation are considered infra. The nature of beam tube 10 is such that accurate control is attained when three functions of the audio signal deriving from it are considered. These functions, illustrated by the plots of FIGS. 2A, 2B and 2C, are second harmonic (200 cycle) amplitude versus microwave input frequency, first harmonic (100 cycle), in phase component versus microwave input frequency and first harmonic, quadrature phase component versus microwave input frequency. (The terms second harmonic, in phase and quadrature components refer to the amplitudes of the 100 cycle wave deriving from tube 10 relative to the reference phase deriving from generator 19 on lead 21.)

As can be noted from FIGS. 2A–2C, the center of atomic resonance of the beam tube is the microwave frequency where there is the unique combination of amplitude nulls for the first harmonic in phase and quadrature components, as well as a maximum of the second harmonic amplitude. The present invention relies upon these observations to control the stabilized frequency of beam tube 10, hence the frequency of crystal oscillator 16. If only the in phase amplitude versus frequency distribution, illustrated in FIG. 2B, is utilized, as has usually been the prior art custom, there is quite a possibility that the beam will stabilize at the frequencies commensurate with false lock points 24 or 25. This arises frequently because there is a first harmonic in phase null at points 24 and 25, and the same slope direction exists there as at the frequency where the center of atomic resonsance occurs.

The remainder of the circuitry described in conjunction with FIG. 1 is employed to lock the frequency of beam tube 10 to the center of atomic resonance, as determined by the stated set of unique conditions for the in phase and quadrature first harmonic components, as well as the second harmonic component.

The audio signal deriving from beam tube 10 is applied in parallel to band pass filters 26 and 27 via amplifier 30. Filters 2 6and 27 are designed to pass the fundamental and second harmonic, respectively, of the beam tube output signal, one to the exclusion of the other. Thereby, the output of filter 26 includes only the first harmonic components, as depicted by FIGS. 2B and 2C, while only the second harmonic components, illustrated in FIG. 2A, derive from filter 27.

To determine the amplitudes of the in phase and quadrature components of the waves passed by fundamental filter 26, synchronous phase detectors 28 and 29 are provided. Detectors 28 and 29 are driven by the reference and quadrature phase outputs of generator 19 on leads 21 and 31, respectively. Each of detectors 28 and 29 is arranged to provide a variable D.C. output voltage. The D.C. voltage is of zero amplitude when the two inputs to the detector are displaced by 90°, of maximum positive amplitude when the inputs are in phase and of maximum negative amplitude when the inputs are exactly out of phase.

In logic circuit 32, the bidirectional, D.C. outputs of detectors 28 and 29 are combined with the unidirectional D.C. output voltage of rectifier 33 that is proportional to the second harmonic component deriving from filter 27. Logic circuit 32 is arranged to produce a "start sweep" or search for center of atomic resonance output signal when (1) the second harmonic component output of rectifier 33 is less than a predetermined amplitude or (2) the first harmonic quadrature component deriving from detector 29 is greater than a predetermined amplitude. A resonable value for the second harmonic component is 20% of the known maximum second harmonic component while the first harmonic quadrature component utilized as a criterion should be approximately 5% of the known total (in phase and quadrature) first harmonic maximum.

Circuit 32 switches from the "start sweep" output to a "stop sweep" or stop search status when each of the following occurs: (1) the second harmonic output of rectifier 33 exceeds a predetermined amplitude, (2) first harmonic in phase signal deriving from detector 28 is less than a predetermined magnitude and (3) the quadrature component, as indicated by the voltage generated by detector 29, is smaller than a predetermined value. Reasonable lower limits for the signals generated by detectors 28 and 29 are 30% and 5% of the total first harmonic maximum amplitude, while the signal deriving from rectifier 33 should be approximately 80% of the known second harmonic total.

When logic circuit 32 is in the "start sweep" mode, it generates an output voltage to close switch 15 and couple the voltage of source 13 to the "C" field input of tube 10. Simultaneously, single pole, double throw switch 34 is activated to connect sweep generator 35 to the input of integrator 17. Sweep circuit 35 has a relatively long period of approximately 100 seconds. As the voltage of generator 35 varies over its sweep period, the input voltage, hence output frequency, of oscillator 16 is swept. As the output frequency of oscillator 16 is swept, the beam of tube 10 is controlled so that the detected outputs indicated in FIGS. 2A–C are generated.

While oscillator 16 is being swept, the "C" field is amplitude modulated by the A.C. from source 13 being superimposed on D.C. source 12. By varying the "C" field of the tube 10, the "C" field dependent resonant lines thereof are swept over a relatively large frequency (on the order of 3 kilocycles) to reduce the signal output of the tube. In response to the signal output of tube 10 being reduced, the amplitudes of the audio signals are reduced to the point where the second harmonic amplitude signal deriving from the rectifier 33 is not sufficient to activate logic circuit 32 into the "stop sweep" status except when the maximum 20% of center lobe 36, FIG. 2A, is attained. The second harmonic amplitude does not reach this value concurrently with the minimum amplitude requirements regarding the fundamental in-phase and quadrature components except at the center of atomic resonance. Thereby, logic circuit 32 is only switched to the "stop sweep" mode at a beam tube frequency in the vicinity of the atomic resonance center and is not switched out of the "start sweep" status when false lock points 24 and 25 are reached.

When the three foregoing requirements are reached whereby logic circuit 32 is switched into the "stop sweep" status, its output signal, as applied to switches 15 and 34, reverses in binary value. This signal now causes switch 15 to open and decouple A.C. source 13 from the "C" field input of tube 10 so that the effect of the A.C. field variation on resonant frequency is eliminated. Simultaneously with switch 15 being opened, switch 34 is activated so the D.C. output of phase detector 28 is coupled to integrator 17 and sweep generator 35 is decoupled from it. In consequence, the microwave frequency applied to tube 10 on lead 11 is now stabilized in a predetermined range, determined by the maximum positive and negative values that detector 28 can generate. The output voltage of detector 28 is finally stabilized at a point wherein the frequency of oscillator 16 is maintained constant at a subharmonic of the beam tube atomic resonant frequency.

If the frequency of tube 10 should deviate from the center of its atomic resonance, one of the inputs to circuit 32 is altered so that the circuit is returned to the "sweep mode" and system operation commences once again to locate the center frequency of atomic resonance. Because there is a possibility that beam tube 10 can be transiently excited off of its center frequency of atomic resonance by noise, shock and/or vibration, circuit 32 includes an averaging device. The averaging device has the relatively long time constant of 1.0 second when circuit 32 is switched from the stop to sweep mode because these transient phenomena rarely occur for a greater duration. When circuit 32 is switched from the sweep to the stop mode, however, the averaging circuit time constant is reduced to the relatively short duration of 0.1 second so that generator 35 is quickly decoupled from oscillator 16 and there is virtually no possibility that the resonant frequency of tube 10 cannot be attained.

Figure 3:
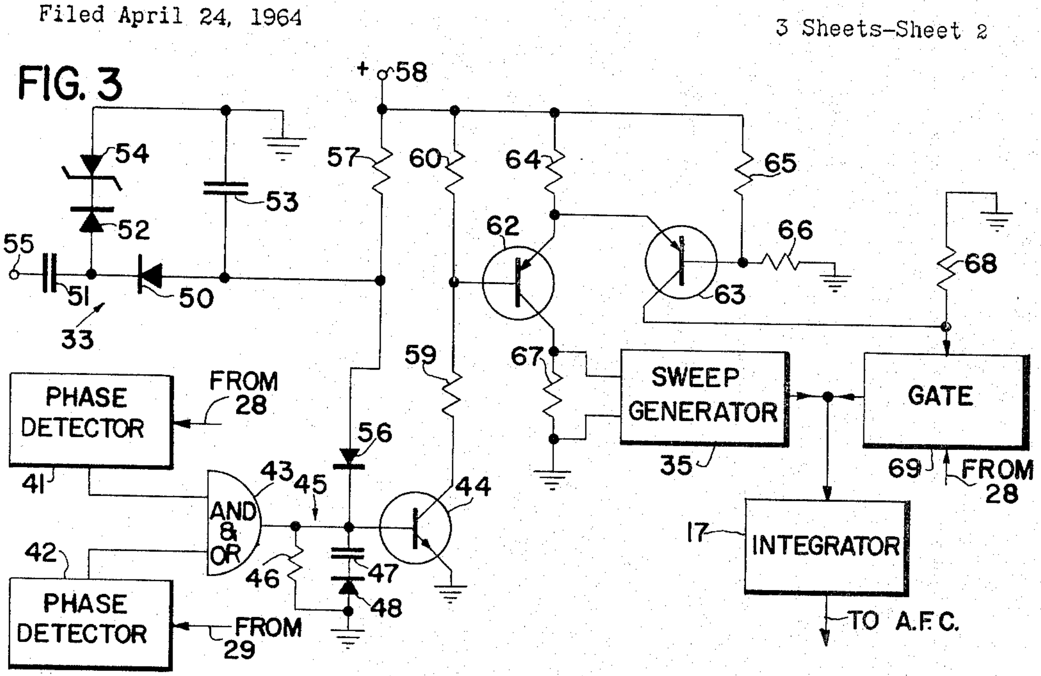
FIG. 3 is a circuit diagram of a logic circuit that can be employed in FIG. 1.

Reference is now made to FIG. 3 of the drawings, where there is illustrated a preferred embodiment of logic circuit 32 in FIG. 1. To convert the bidirectional D.C. control signals indicative of the in-phase and quadrature components of the fundamental into unidirectional signals, the outputs of phase detectors 28 and 29 are coupled to phase detectors 41 and 42, respectively. Detectors 41 and 42 are also supplied with A.C. reference and quadrature phase signals via leads 21 and 31, respectively, so that they always generate positive D.C. signals and thus serve as absolute value circuits for the outputs of detectors 28 and 29. The signals deriving from detectors 41 and 42 are applied to ANDOR gate 43. If the output of one of detectors 41 and 42 is greater than a predetermined amount, as indicated by "stop sweep" mode items 2 and 3, ANDOR gate 43 generates a positive output signal. Only if the outputs of both detectors are less than the predetermined amount, is a negative voltage produced by gate 43.

The output of gate 43 is applied to the base of NPN transistor 44 via averaging circuit 45 that includes resistor 46, shunted by the series combination of capacitor 47 and diode 48. Averaging circuit 45 and the base of transistor 44 are also responsive to the rectified, negative D.C. voltage deriving from rectifier 33, which voltage is indicative of second harmonic content.

Rectifier 33 includes a voltage doubler comprising series diode 50 and capacitor 51, as well as shunt diode 52 and capacitor 53. Connected in series with diode 52 is Zener diode 54 for establishing a negative reference voltage that must be attained by the second harmonic input applied to terminal 55 before rectifier 33 functions as a voltage doubler. The output of rectifier 33 is applied to the base of transistor 44 via coupling diode 56, having its anode connected through resistor 57 to positive bias voltage terminal 58.

The collector emitter circuit of transistor 44 is connected to terminal 58 via series resistors 59 and 60, having a tap between them that is connected to the base of PNP transistor 62. PNP transistors 62 and 63 are connected in a single common emitter circuit to terminal 58 via resistor 64. Emitter-base bias for the former is established via resistors 60 and 64 and for the latter by resistors 65 and 66. The complementary, out of phase voltages developed across collector load resistors 67 and 68 of transistors 62 and 63 are applied as gate inputs to sweep generator 35 and gate 69.

To describe the system operation, it is initially assumed that the A.C. voltage at terminal 55 is insufficient to activate rectifier 33 so it does not function as a voltage doubler. Also, the outputs of phase detectors 41 and 42 are both large enough to enable a positive voltage to be generated by the gate 43. In consequence, positive currents are supplied to the base of transistor 44 by the gate 43 and terminal 58 via resistor 57 and diode 56. These positive currents result in capacitor 47 being charged to a positive voltage and heavy collector current through transistor 44. Collector current through transistor 44 results in negative current flow to the base of transistor 62, so the transistor conducts and a positive input is coupled by resistor 67 to sweep generator 35. The positive input to generator 35 causes it to commence its slow voltage variation. In the meantime, the voltage across resistor 64 biases transistor 63 into cut-off and a zero, gate closing input voltage is applied by resistor 68 to the control input of gate 69. Thus, the sweep generator 35 variable voltage is applied as a frequency control to oscillator 16, the output of phase detector 28 is decoupled from the oscillator and A.C. voltage from source 13 is coupled to the "C" field input of tube 10, i.e. the system is in the search or sweep state.

If only one or two of the inputs to logic circuit 32 change state, the logic circuit will remain in the search state. This may be seen by first considering the circuit operation if both of the inputs to the gate 43 drop to a value insufficient to enable the derivation of a positive output by the gate, so that the gate output drops to zero. There is still a positive voltage applied to the base of transistor 44 from terminal 58 via resistor 57 and diode 56 so logic circuit 32 derives an output to maintain the system in the sweep state.

Next, consider the situation when the second harmonic voltage deriving from filter 27 exceeds the reference voltage established by Zener diode 54, at the same time as when a positive signal is being generated by the gate 43. when this occurs, a negative voltage is developed across capacitor 53. The voltage is large enough to cancel the effects of the positive current flowing from terminal 58 so that diode 56 is cut-off. Thereby, no positive current flows to the base of transistor 44 through diode 56. Nevertheless, the positive output voltage of gate 43 biases transistor 44 into conduction and logic circuit 32 remains in the search state.

When a zero output voltage is developed by the gate 43 simultaneously with a negative output being generated by rectifier 33, capacitor 47 discharges at a relatively rapid rate (with a 0.1 second time constant) through resistor 46 and diode 48. When most of the charge on capacitor 47 has been removed, transistor 44 is driven into cut off and the states of transistors 62 and 63 are reversed. Upon such an occurrence, the positive input voltage to generator 35 is reduced to zero, and the sweep voltage drops to zero. Simultaneously, gate 69 is triggered open by the positive votlage across resistor 68 so that the output of phase detector 28 controls oscillator 16 and the beam tube Q increases in response to opening of switch 15.

The logic circuit remains in this status until a positive voltage is applied to averaging circuit 45 for approximately 1.0 second. As indicated supra, the 1 second delay is to prevent spurious activation into the search state by transients. The requirement for a 1.0 second response is attained by the long RC time constant provided by the high backward impedance of diode 48 to the flow of positive current through it from gate 43 or diode 56.

Figure 4:
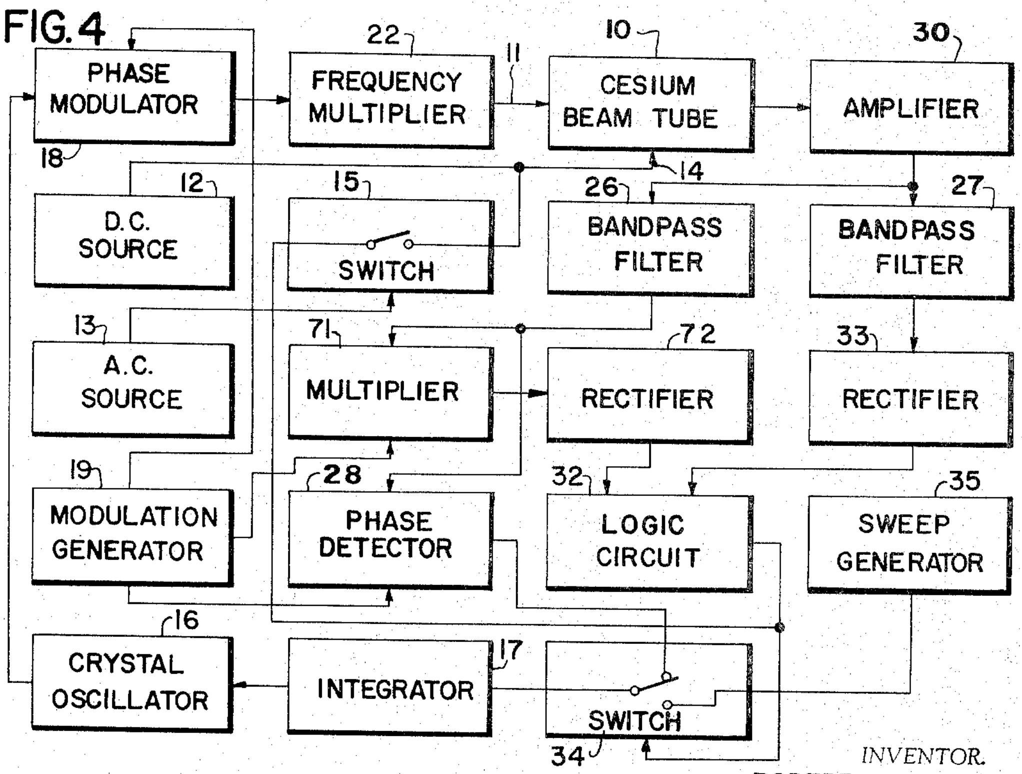
FIG. 4 is a block diagram of another preferred embodiment.

Reference is now made to FIG. 4 of the drawings wherein the circuit of FIG. 1 is modified so that detectors 29, 41 and 42 and the gate 43 are not required. In their place, the indication of quadrature component is derived by connecting analog multiplier 71 to be responsive to the first harmonic output of filter 26 and a double frequency component deriving from modulation generator 19. Generator 19 is modified so its only outputs are 100 cycles and 200 cycles, instead of being 100 cycles in phase and quadrature components. The 100 cycles output of generator 19 is utilized as a reference input to phase detector 28, the information input of which is from first harmonic filter 26. The output of detector 28 is utilized only for tracking when the system is switched to the stop mode and does not influence the stop and search logic of FIG. 4.

Instead, multiplier 71 generates a signal that accentuates the low voltage out of phase component deriving from filter 26. This is accomplished by arranging the phases of the quadrature and second harmonic waves applied to multiplier 71 to be of peak values at the same time, i.e. whenever the second harmonic attains a positive peak, the quadrature fundamental is at either a positive or negative peak. The first and second harmonic waves deriving from multiplier 71 are converted into a D.C. voltage by rectifier 72 and then applied as an input to logic circuit 32. The second harmonic input to circuit 32 is derived exactly as shown in FIG. 1.

Figure 5:
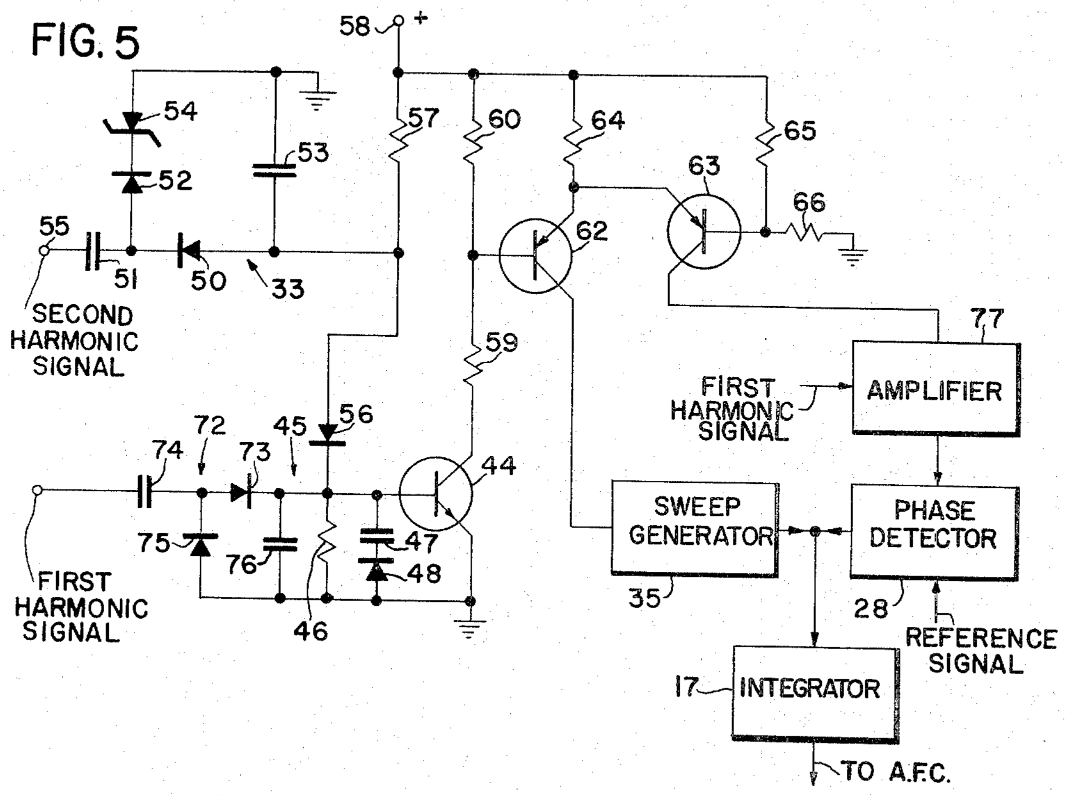
FIG. 5 is a circuit diagram of a logic circuit that can be employed in FIG. 4.

Reference is now made to FIG. 5 of the drawings which illustrates the logic circuit employed in FIG. 4. In FIG. 5, the base of transistor 44 is supplied with only two signals, the outputs of rectifiers 33 and 72. Since the construction of rectifier 33 is exactly the same as in the circuit of FIG. 3, there is no need to discuss this circuit further.

Rectifier 72 is a voltage doubler including series diode 73 and capacitor 74 that is directly responsive to the output of multiplier 71. Connected in shunt across opposed electrodes of diode 73 are diode 75 and capacitor 76, so that a positive D.C. voltage directly proportional to the total A.C. energy deriving from multiplier 71 is applied across the base-emitter junction of transistor 44. If the positive D.C. signal applied to the base of transistor 44, due to energization of doubler 72 or de-activation of rectifier 33, is of predetermined magnitude, transistors 62 and 63 are on and off, respectively, and the system is in the sweep mode. With the system so activated, it operates exactly as the oscillator of FIG. 1. When, however, transistor 44 is turned off and transistor 63 is activated there is a slight departure from the circuits of FIGS. 1 and 3. This involves gating the first harmonic output of filter 26 through gated amplifier 77 to phase detector 28 for controlling the frequency of oscillator 16.

Figure 6:
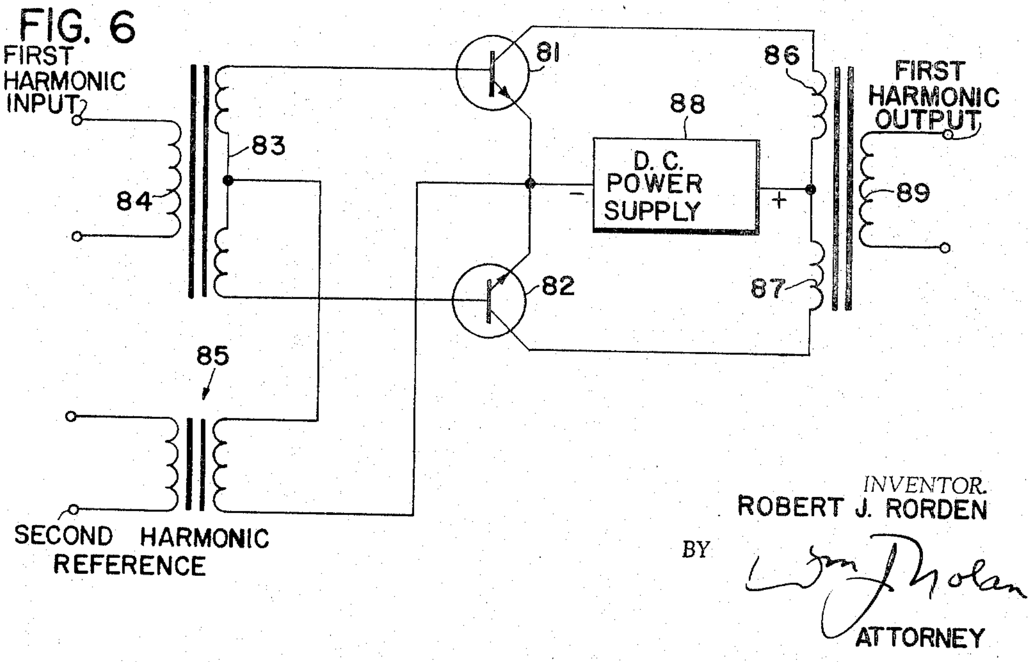
FIG. 6 is a circuit diagram of a multiplier that can be utilized in FIG. 4.

A preferred embodiment of multiplier 71 is illustrated in FIG. 6. It comprises a balanced modulator employing NPN transistors 81 and 82, having their bases connected to either end of secondary transformer winding 83. The transformer primary 84 is responsive to the first harmonic output of filter 26. Between the center tap of winding 83 and the common terminal of the emitters of transistors 81 and 82, is impressed the second harmonic reference frequency, fed from modulator generator 19 via transformer 85. The phases of the inputs to winding 84 and transformer 85 are adjusted so that one of transistors 81 or 82 is of maximum gain, in response to the second harmonic, when peak positive and negative values of the fundamental quadrature component occurs. Thereby the current applied by D.C. source 88 to split primary windings 86 and 87 on alternate half cycles of the second harmonic accentuates the quadrature components and still provides accurate indications of the in phase components of the signal deriving from filter 26. (The terms quadrature and in phase are with regard to the phase of the fundamental frequency applied by generator 19 to phase modulator 18.)

Because there is an A.C. signal generated across secondary winding 89, conventional rectifier 72 can be employed. This is in contrast with the dual polarity, D.C. output signals generated by phase detectors 28 and 29, FIG. 1, which must be converted into unidirectional, D.C. control signals.

While I have described and illustrated several specific embodiments of my invention, it will be clear that variations of the details of construction which are specifically illustrated and described may be resorted to without departing from the true spirit and scope of the invention as defined in the appended claims.

I claim:

1. A system for stabilizing the frequency of a variable frequency oscillator comprising a passive atomic resonator, a source of reference frequency and phase, means responsive to said oscillator and said source for applying microwave energy frequency modulated by said source to said resonator, means for detecting oscillations deriving from said resonator, means responsive to said oscillations for deriving a first signal indicative of the in-phase and quadrature fundamental components of said oscillations relative to the reference frequency and phase and a second signal indicative of the second harmonic components of said oscillations relative to said reference frequency, means for combining said first and second signals to derive a control signal, means for deriving a first control voltage for sweeping the frequency of the oscillator over a wide range, means responsive to said oscillations for deriving a second control voltage indicative of the in-phase component of said oscillations, and means responsive to said control signal for selectively applying the first control voltage or the second control voltage to said oscillator.

2. The system of claim 1 wherein said means for deriving the first signal comprises a pair of phase detectors responsive to only the fundamental components of said oscillations, one of said detectors being responsive to the reference phase deriving from said source, the other of said detectors being responsive to oscillations in quadrature with the reference phase of said source.

3. The system of claim 1 wherein said means for deriving the first signal comprises a signal multiplier having one input responsive to the fundamental component of said oscillations relative to the reference frequency, the other input of said multiplier being responsive to the second harmonic of the reference frequency deriving from the source.

4. The system of claim 3 including means for adjusting the phases of the inputs to said multiplier so that maximum magnitudes of the second harmonic occurs simultaneously with the maximum positive and negative values of the fundamental quadrature component of said oscillations.

5. The system of claim 1 further including means for maintaining a static magnetic field within said resonator, and means responsive to said control signal for cyclically varying the magnitude of said field only when the first control voltage is applied to said oscillator.

6. A system for stabilizing the frequency of a variable frequency oscillator comprising an atomic beam frequency standard, a source, of reference frequency and phase, means responsive to said oscillator and said source for applying microwave energy frequency modulated by said source to said standard, means for detecting oscillations deriving from said standard, means responsive to said oscillations for deriving a first signal indicative of the in-phase and quadrature fundamental components of said oscillations relative to the reference frequency and phase and a second signal indicative of the second harmonic components of said oscillations relative to said reference frequency, means for combining said first and second signals to derive a first control signal when either the in-phase or quadrature components exceed a predetermined amplitude or the second harmonic component is less than a predetermined amplitude and a second control signal when the first control signal is not derived, means for deriving a first control voltage for sweeping the oscillator frequency over a wide range, means responsive to said oscillations for deriving a second control voltage indicative of the in-phase component, means responsive only to said first control signal for applying the second control voltage to said oscillator, means responsive only to said second control signal for applying the first control voltage to said oscillator.

7. The system of caim 6 further including means for maintaining a static magnetic field within said standard, and means responsive to said control signal for cyclically varying the magnitude of said field only when the first control voltage is applied to said oscillator.

8. The system of claim 6 wherein said combining means includes means for maintaining the derivation of said second signal when either of said fundamental components transiently exceed said predetermined amplitude and when the second harmonic component is transiently less than the predetermined amplitude.

9. In a system for stabilizing the frequency of a variable frequency oscillator, a passive atomic resonator including means for establishing a static magnetic field, means for cyclically varying said field, means responsive to said oscillator for coupling microwave energy to said resonator, means responsive to detected oscillations deriving from said resonator for deriving a control signal indicative of the resonant condition of said resonator, means for sweeping the frequency of said oscillator, and means responsive to said control signal for decoupling said means for sweeping from said oscillator and for decoupling said field varying means from said field establishing means only when the center of atomic resonance of said resonator is approached.

10. A system for stabilizing the frequency of a variable frequency oscillator comprising an atomic beam frequency standard including means for establishing a static magnetic field, means for cyclically varying said field, a source of reference frequency and phase, means responsive to said oscillator and said source for applying microwave energy frequency modulated by said source to said standard, means for detecting oscillations deriving from said standard, means responsive to detected oscillations deriving from said standard for deriving a control signal indicative of the resonant condition of said standard, means for sweeping the frequency of said oscillator, and means responsive to said control signal for decoupling said means for sweeping from said oscillator and for decoupling said field varying means from said field establishing means only when the center of atomic resonance of said standard is approached.

References Cited

UNITED STATES PATENTS 3,206,693 9/1965 Caldwell. ____________ 331—4 X

ROY LAKE, *Primary Examiner.*

S. H. GRIMM, *Assistant Examiner.*